US009343146B2

(12) United States Patent
Lee

(10) Patent No.: US 9,343,146 B2

(45) Date of Patent: May 17, 2016

(54) APPARATUSES AND METHODS FOR LOW POWER CURRENT MODE SENSE AMPLIFICATION

(75) Inventor: Seong-Hoon Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 471 days.

(21) Appl. No.: 13/347,613

(22) Filed: Jan. 10, 2012

(65) Prior Publication Data

US 2013/0176078 A1 Jul. 11, 2013

(51) Int. Cl.

| | |
|---|---|
| ***G11C 11/34*** | (2006.01) |
| ***G11C 7/02*** | (2006.01) |
| ***G11C 13/00*** | (2006.01) |
| ***G11C 7/06*** | (2006.01) |
| ***G11C 7/12*** | (2006.01) |

(52) U.S. Cl.

CPC .............. *G11C 13/004* (2013.01); *G11C 7/062* (2013.01); *G11C 7/12* (2013.01); *G11C 2013/0042* (2013.01); *G11C 2013/0045* (2013.01); *G11C 2207/063* (2013.01)

(58) Field of Classification Search

CPC ..................... G11C 2013/0042; G11C 13/004; G11C 2013/0045; G11C 2207/063; G11C 11/4091; G11C 16/28; G11C 7/062; G11C 7/065

USPC ............................ 365/207, 185.21, 196, 205

See application file for complete search history.

(56) References Cited

U.S. PATENT DOCUMENTS

| | | | | |
|---|---|---|---|---|
| 5,162,681 | A * | 11/1992 | Lee | 327/53 |
| 5,608,676 | A * | 3/1997 | Medlock et al. | 365/189.09 |
| 6,396,310 | B2 * | 5/2002 | Shin | G11C 7/062 327/55 |
| 6,449,191 | B1 | 9/2002 | Lin et al. | |
| 6,483,353 | B2 * | 11/2002 | Kim et al. | 327/55 |
| 7,495,984 | B2 | 2/2009 | Kim et al. | |
| 8,030,972 | B2 * | 10/2011 | Jansson | 327/54 |
| 2005/0213387 | A1 * | 9/2005 | Kubo et al. | 365/185.21 |
| 2008/0074174 | A1 * | 3/2008 | Tang | 327/543 |
| 2010/0202213 | A1 | 8/2010 | Lin et al. | |
| 2011/0182129 | A1 * | 7/2011 | Lee | 365/207 |
| 2013/0027133 | A1 * | 1/2013 | Lee | 330/254 |

OTHER PUBLICATIONS

Sasaki, K., et al., "A 9-ns. 1-Mbit CMOS SRAM," IEEE J. Solid-State Circuits, vol. 24, No. 5, pp. 1219-1224, Oct. 1989.*

* cited by examiner

*Primary Examiner* — Khamdan Alrobaie

(74) *Attorney, Agent, or Firm* — Dorsey & Whitney LLP

(57) ABSTRACT

Memory apparatuses and methods for low power current mode sense amplification are disclosed. An example memory apparatus may include a current mode sense amplifier and a current circuit. The current mode sense amplifier may be configured to provide an output current. The current circuit may comprise a bias generator that is configured to generate a bias signal as well as a current control circuit coupled to both the current mode sense amplifier and the bias generator. The current control circuit may be configured to receive both the output current and the bias signal and control the output current based, at least in part, on the bias signal.

23 Claims, 5 Drawing Sheets

300
206
MEMORY CORE
GIOb
GIO
202
206
210
220
222
208
EQ
216
EQ
En
214
ICSA
212
305
$I_{REF}$
CSAbias
308
306
310
302
Vss
304
300

APPARATUSES AND METHODS FOR LOW POWER CURRENT MODE SENSE AMPLIFICATION

TECHNICAL FIELD

Embodiments of the invention relate generally to memory devices, and more particularly, in one or more illustrated embodiments, to current mode sense amplifiers configured to operate in a low power state.

BACKGROUND OF THE INVENTION

Current mode sense amplifiers have been used in integrated circuits to sense and/or amplify differential input currents. In applications in semiconductor memory, for example, the current mode sense amplifiers are often used to sense and amplify input currents resulting from reading memory cell data and being provided over relatively long signal lines.

In providing memory cell data, signal lines may be pre-charged to a supply voltage VCC. Depending on the application and/or design of a semiconductor memory, the supply voltage VCC of the memory may have a relatively small or large magnitude relative to other implementations.

Typically, differential input currents received from memory are voltage dependent on the supply voltage VCC. For example, the input currents and VCC may be linearly proportional to one another. As a result of increasing VCC, the input currents may increase as well.

As known the supply voltage VCC may fluctuate, varying over a range of voltages during operation. Where VCC is at a lower end of the range, input currents typically are very weak and low in magnitude. The differential input currents received from the memory may have low signal margins, and performance issues, such as data read errors, may result. On the other hand, where the VCC is at a higher end of the range, the differential current may exceed what is required to properly sense memory cell data. Consequently, in reading data out of memory, power may be needlessly consumed. Therefore, there is a need for a more reliable and efficient apparatus for sensing read data, for example, from a memory array despite variations in supply voltage.

DETAILED DESCRIPTION

Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
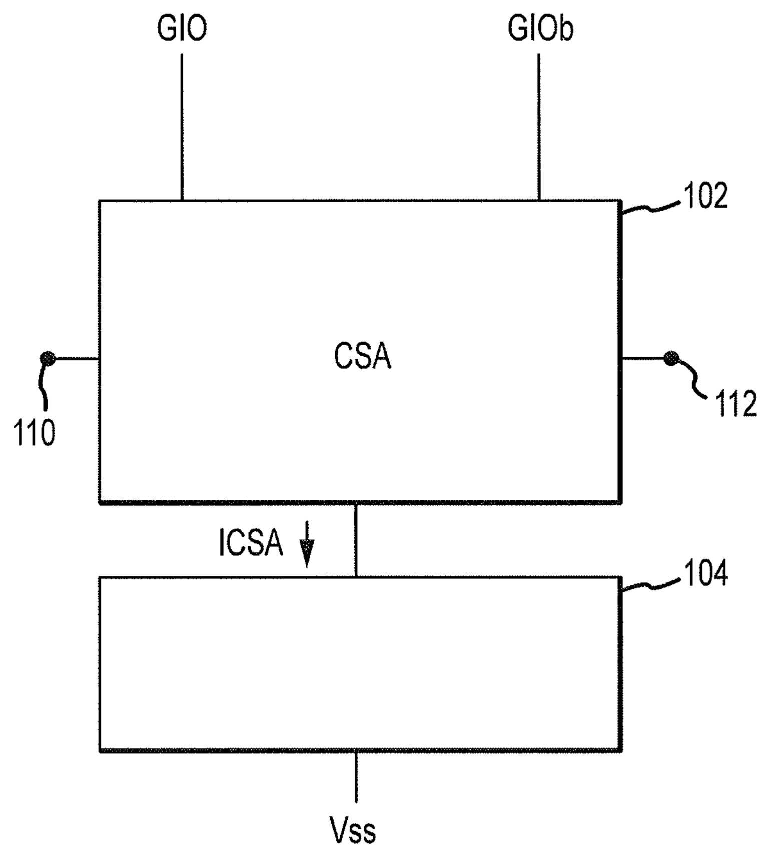
FIG. 1 illustrates a block diagram of an apparatus according to an embodiment of the invention.

FIG. 1 illustrates an apparatus 100 according to an embodiment of the invention. The apparatus 100 may include a current mode sense amplifier 102 and a current circuit 104. The current mode sense amplifier 102 may be coupled to a pair of differential signal lines. As known, each signal line of the pair of differential signal lines may be used to carry a complementary signal of the other signal line. In some embodiments, for example the embodiment illustrated in FIG. 1, the differential signal lines may be global input-output lines GIO and GIOb. The GIO, GIOb lines may, for example, be relatively long signal lines, such as signal lines for providing data to and from a memory array. The current circuit 104 may be coupled to the current mode sense amplifier 102, and further may be coupled to a supply voltage, such as a low supply voltage VSS. In some embodiments, the low supply voltage VSS may be ground. It will be appreciated by those having ordinary skill in the art that other implementations may be used without departing from the scope of the invention.

In an example operation, the current mode sense amplifier 102 may receive signals via the GIO and GIOb lines. The signals may, for instance, be differential currents and/or correspond to data stored in a memory array. In particular, in at least one embodiment, GIO and GIOb lines may be pre-charged to a supply voltage VCC, and responsive, at least in part, to the current mode sense amplifier 102 being enabled, one of the bit lines GIO, GIOb may change in voltage level. The supply voltage VCC may correspond to any voltage magnitude, and in at least one embodiment, may be in a voltage range between, for example, 0.8V-1.5V.

The sense amplifier 102 may sense a current difference between the signals on bit lines GIO and GIOb and provide the signals to output nodes 110, 112. In one embodiment, the current mode sense amplifier 102 may amplify and/or latch the signals when providing the signals to the output nodes 110, 112. The signals may be further provided from the output nodes 110, 112 to an external device, such as a read/write circuit (not shown in FIG. 1), and may be provided to other devices as well, such as an output buffer (not shown in FIG. 1). In providing the signals to the output nodes 110 and 112, a current ICSA is developed by the current mode sense amplifier 102. The current mode sense amplifier 102 may, for instance, provide the ICSA current to the current circuit 104.

The current circuit 104 may be configured to control the ICSA current of the current mode sense amplifier 102. For instance, the current circuit 104 may increase or decrease the magnitude of the ICSA current of the current mode sense amplifier 102. As will be explained in more detail below, controlling the ICSA current of the current mode sense amplifier 102 may reduce variation of the ICSA current and/or reduce the voltage dependency of the ICSA current on the supply voltage VCC. That is, controlling the ICSA current, for instance, may cause the ICSA current to fluctuate less in response to increases or decreases of the supply voltage VCC. As known, in a conventional current mode sense amplifier, a current of the current mode sense amplifier may be affected by a supply voltage VCC to which the current mode sense amplifier is provided and input resistance. For example, the magnitude of the sense amplifier current may be proportional (e.g. linearly proportional or logarithmically proportional) either to the magnitude of the voltage of the supply voltage VCC, or to the magnitude of the input resistance of the current mode sense amplifier 102, or both.

Figure 2:
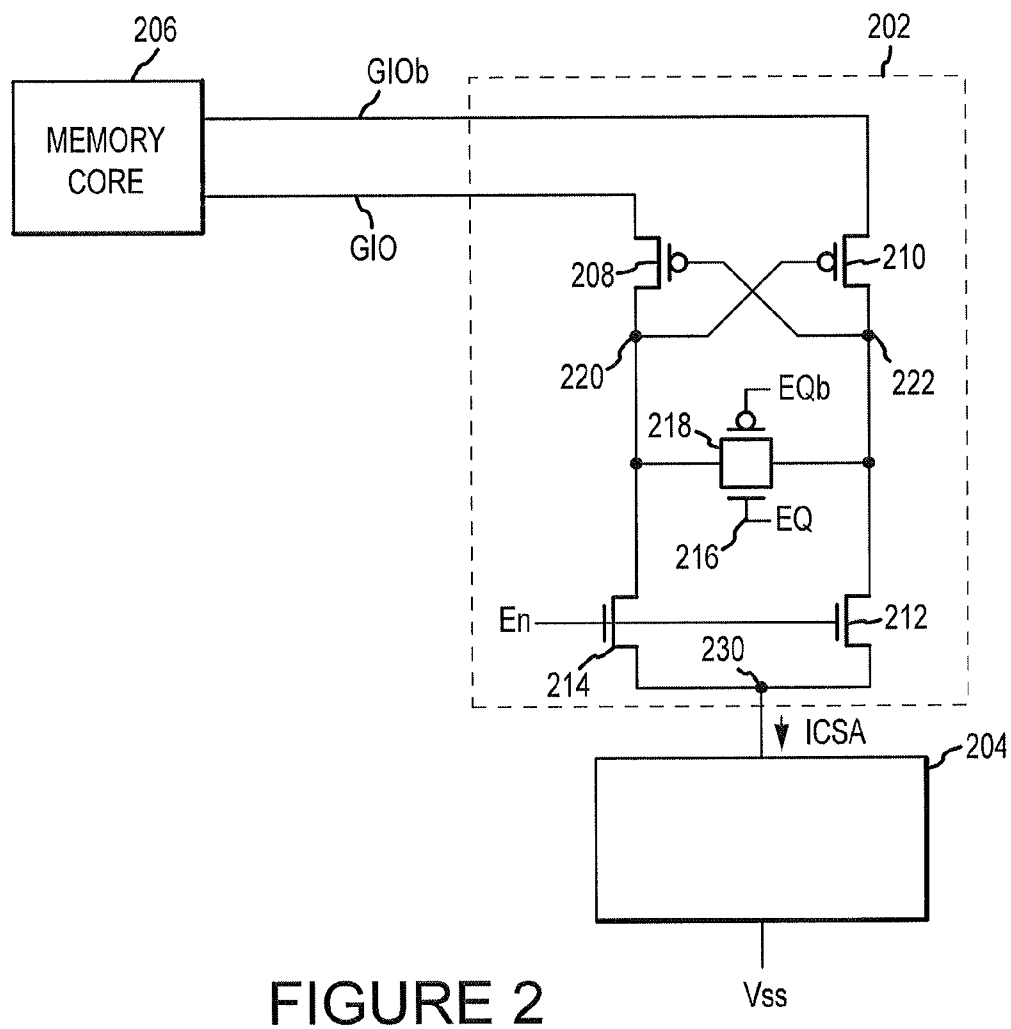
FIG. 2 illustrates a schematic diagram of an apparatus according to an embodiment of the invention.

FIG. 2 illustrates an apparatus 200 according to an embodiment of the invention. The apparatus 200 may include a memory core 206, a current mode sense amplifier 202 and a current circuit 204. The current circuit 204 may be similar to the current circuit 104 described with reference to FIG. 1. The current mode sense amplifier 202 may be coupled to the memory core 206 by signal lines GIO and GIOb. In some embodiments, the GIO, GIOb lines are differential signal lines. In one embodiment, the memory core 206 may comprise an array of memory cells and the GIO and GIOb lines may comprise input-output lines extending through the memory array.

The current mode sense amplifier 202 illustrated in FIG. 2 includes a pair of transistors 208, 210 that may be coupled to the GIO and GIOb lines, respectively. The transistors 208, 210 may comprise metal-oxide semiconductor ("MOSFETs") or junction gate field effect transistors ("JFETs"), or may comprise other types of transistors known by those having skill in the art, such as bipolar junction transistors ("BJTs"). In the embodiment of FIG. 2, the transistors 208, 210 are illustrated as p-channel transistors. However, the transistors 208, 210 may be other types of transistors as well, including n-channel transistors. The current mode sense amplifier 202 further includes switches 216, 218 coupled to the transistors 208, 210. The switches 216, 218 may be used during equilibration of the sense amplifier 202, to couple output nodes 220, 222 together so that the voltages are equal. The switches 216, 218 may be MOSFETs, as illustrated in FIG. 2, or may be other types of switches known by those having ordinary skill in the art. The switches 216, 218 may be configured to be respectively controlled by switch signals EQ and EQb, that in at least one embodiment, may be complementary signals.

The switches 216, 218 are further coupled to transistors 214, 212, respectively. The transistors 212, 214 may comprise field effect transistors (e.g. MOSFETs or JFETs), BJTs, or other transistors known by those having skill in the art. In particular, as illustrated in FIG. 2, the transistors 212, 214 may be n-channel transistors. The transistors 212, 214 may, however, also be other types of transistors, such as p-channel transistors. The transistors 212, 214 may be configured to be controlled by a control signal, for instance, an enable signal EN. In other embodiments, each of the transistors 212, 214 may be configured to be controlled by separate control signals. The current mode sense amplifier 202 is coupled to the current circuit 204. In particular, the drains of the transistors 212, 214 may be coupled to one another and the current circuit 204 at the node 230.

In an example operation, memory core 206 may provide signals to the current mode sense amplifier 202 via the GIO and GIOb lines. In one embodiment, the GIO and GIOb lines may be precharged, for example, to the supply voltage VCC, as described above. The signals may then be sensed and/or amplified by the current mode sense amplifier 202.

In particular, by enabling transistors 212, 214, transistors 208, 210 may in turn be enabled to cause signals received via the GIO and GIOb lines to be applied to output nodes 220, 222. For example, the signals on the GIO and GIOb lines may cause one of the transistors 208, 210 to be enabled (e.g., made conductive) while the other transistor remains disabled (e.g., not conductive). Enabling some or all of the transistors 208, 210, 212, 214 results in some current (i.e., the ICSA current) flowing from the GIO and GIOb lines to the current circuit 204, as previously discussed. The ICSA current may be controlled at least in part by the current circuit 204. As will be explained in more detail below, while the ICSA current provided by the sense amplifier 202 may maintain some dependency on the magnitude of the supply voltage VCC, the dependency of the ICSA current on the magnitude of VCC may be reduced based on the current circuit 204 controlling the ICSA current.

Figure 3:
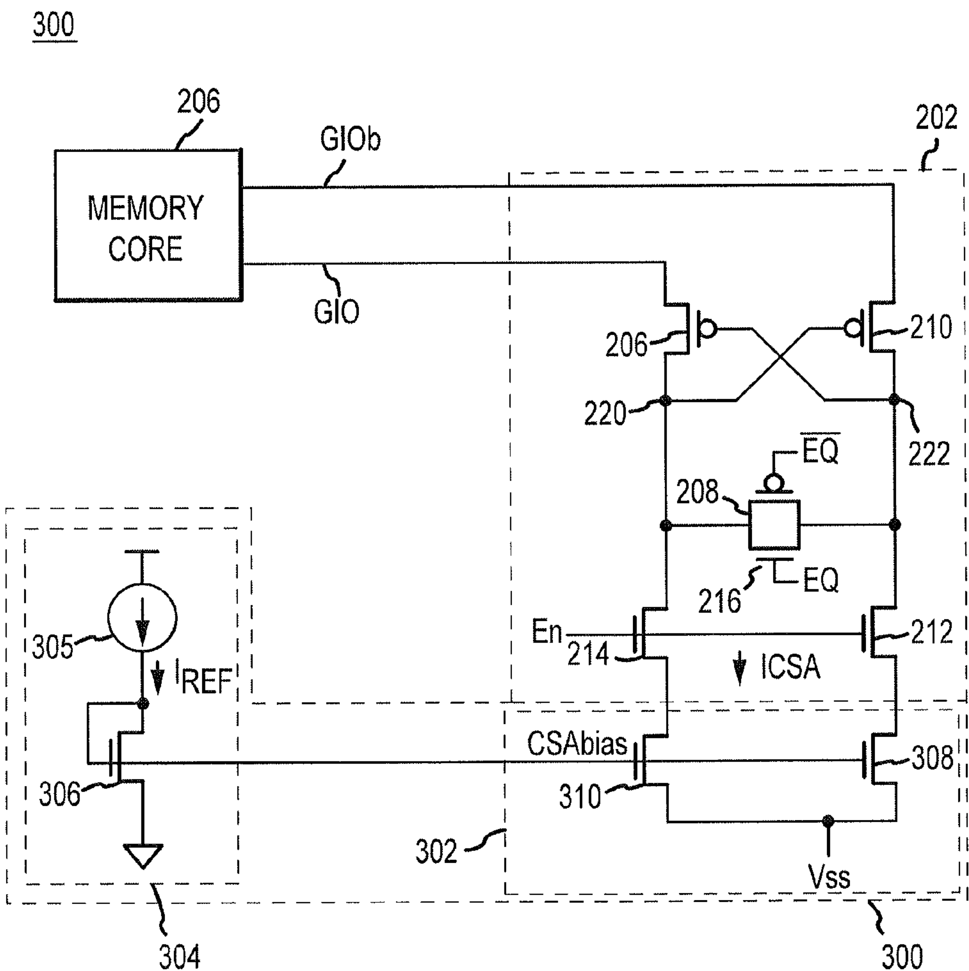
FIG. 3 illustrates a schematic diagram of an apparatus according to an embodiment of the invention.

FIG. 3 illustrates a current circuit 300 according to an embodiment of the present invention. The current circuit 300 may be used as the current circuit 104 (FIG. 1) and/or the current circuit 204 (FIG. 2). The current circuit 300 is illustrated in FIG. 3 as coupled to and will be described in operation with reference to the current mode sense amplifier 202. The current circuit 300 includes a current control circuit 302. The control circuit 302 may be configured to control or at least control in part the ICSA current based, at least in part, on a bias signal CSAbias. The current control circuit 302 may include a pair of transistors 308, 310. The transistors 308, 310 may be configured to receive the CSAbias signal at their respective gate terminals. In other embodiments, the transistors 308, 310 may be configured to receive separate bias signals. The transistors 308, 310 may be coupled to transistors 212, 214 of the current mode sense amplifier 202, respectively. Further, the transistors 308, 310 may comprise field effect transistors (e.g. MOSFETs or JFETs), BJTs, or any other transistors known by those having skill in the art. In one embodiment, the transistors 308, 310 may be coupled between the transistors 212, 214 and a supply voltage, such as a low supply voltage VSS, as shown in FIG. 3.

The current circuit 300 may further comprise a bias generator 304. The bias generator is configured to provide the CSAbias signal to the current control circuit 302. The bias generator in the embodiment illustrated in FIG. 3 includes a current source 305 and a transistor 306. The current source 305 is configured to provide a reference current IREF. The transistor 306, for instance, may comprise a diode coupled transistor and further may be coupled between the current source 305 and a supply voltage, such as a low supply voltage VSS. The current source 305 may comprise a passive current source, such a series coupled resistor and voltage source, and/or the current source 305 may comprise an active current source, such as a zener diode current source. It will be appreciated by those having ordinary skill in the art that various implementations, such as an operational amplifier current source or a voltage regulator current source, may also be used without departing from the scope of the present invention.

In an example operation, the bias generator 304 may generate the CSAbias signal. The CSAbias signal may, for instance, be based, at least in part, on the IREF current generated by the current source 305 and, may be an analog voltage signal. Moreover, the bias signal CSAbias may be independent of supply voltages, such as the supply voltage VCC. For example, the voltage of the CSAbias signal may not be affected by variations in the VCC voltage.

The transistor 306 of the bias generator 304 provides the transistors 308, 310 of the current control circuit 302 the CSAbias signal at their respective gate terminals. As a result, the current passing through the bias generator 304 (i.e., the IREF current) and the current passing through the current control circuit 302 (i.e., the ICSA current of the current mode sense amplifier 202) may be related. For instance, the ICSA current may have a magnitude proportional to the magnitude of IREF current. By providing the CSAbias signal to the transistors 308, 310, the IREF current may be mirrored by the transistors 308, 310 such that the IREF current and the ICSA current are approximately equal or have magnitudes within a predetermined threshold. In at least one embodiment, the ratio between the magnitudes of the IREF current and the ICSA current may be based, at least in part, on the physical characteristics of reference transistor 306 and transistors 308, 310. For instance, matching reference transistor 306 to transistors 308, 310 (i.e. same channel length, width, threshold voltage) may result in the IREF current and the ICSA current having approximately the same magnitude.

Figure 4:
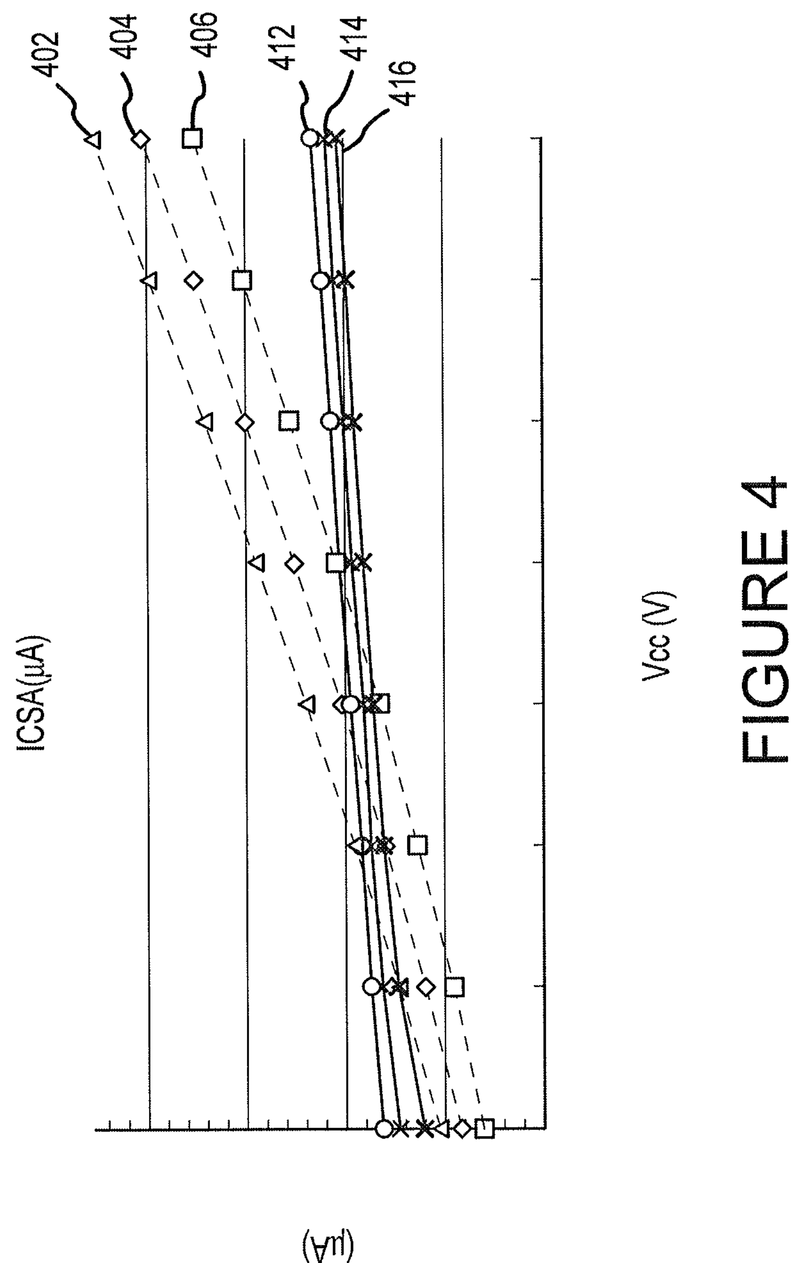
FIG. 4 illustrates a diagram of output current variation over a voltage range related to operation of an apparatus according to an embodiment of the invention.

As previously discussed, an apparatus may include a current circuit, such as the current circuit 300 of FIG. 3, to control the output current of a current mode sense amplifier. Coupling the current mode sense amplifier to the current circuit 300 may, for example, reduce the dependency of the ICSA current of the current mode sense amplifier on a supply voltage. FIG. 4 illustrates lines 402, 404, 406, 412, 414, and 416, each representing a variation of ICSA current magnitude over a voltage range of a supply voltage VCC. The lines 402, 404, 406, 412, 414, and 416 are illustrated to show general responses of the ICSA current, and are not intended to accurately portray the magnitude of the ICSA current. For example, lines 402, 404, and 406 may represent fast, typical, and slow process models, respectively, for the ICSA current of a current mode sense amplifier operating without a current circuit according to an embodiment of the invention. The solid lines 412, 414, and 416 may represent the ICSA current of the current mode sense amplifier coupled to a current circuit according to an embodiment of the invention, for example, the current circuit 300 of FIG. 3, for respective fast, typical, and slow process models.

Accordingly, it is recognizable from the illustration of FIG. 4 that a current circuit may control the ICSA current of a current mode sense amplifier. In the illustration of FIG. 4, for example, the ICSA current of a current mode sense amplifier may vary less with respect to a supply voltage when the current mode sense amplifier is used with a current circuit as opposed to without. That is, controlling the ICSA current may include reducing the variation of the output current as VCC is increased or decreased.

Figure 5:
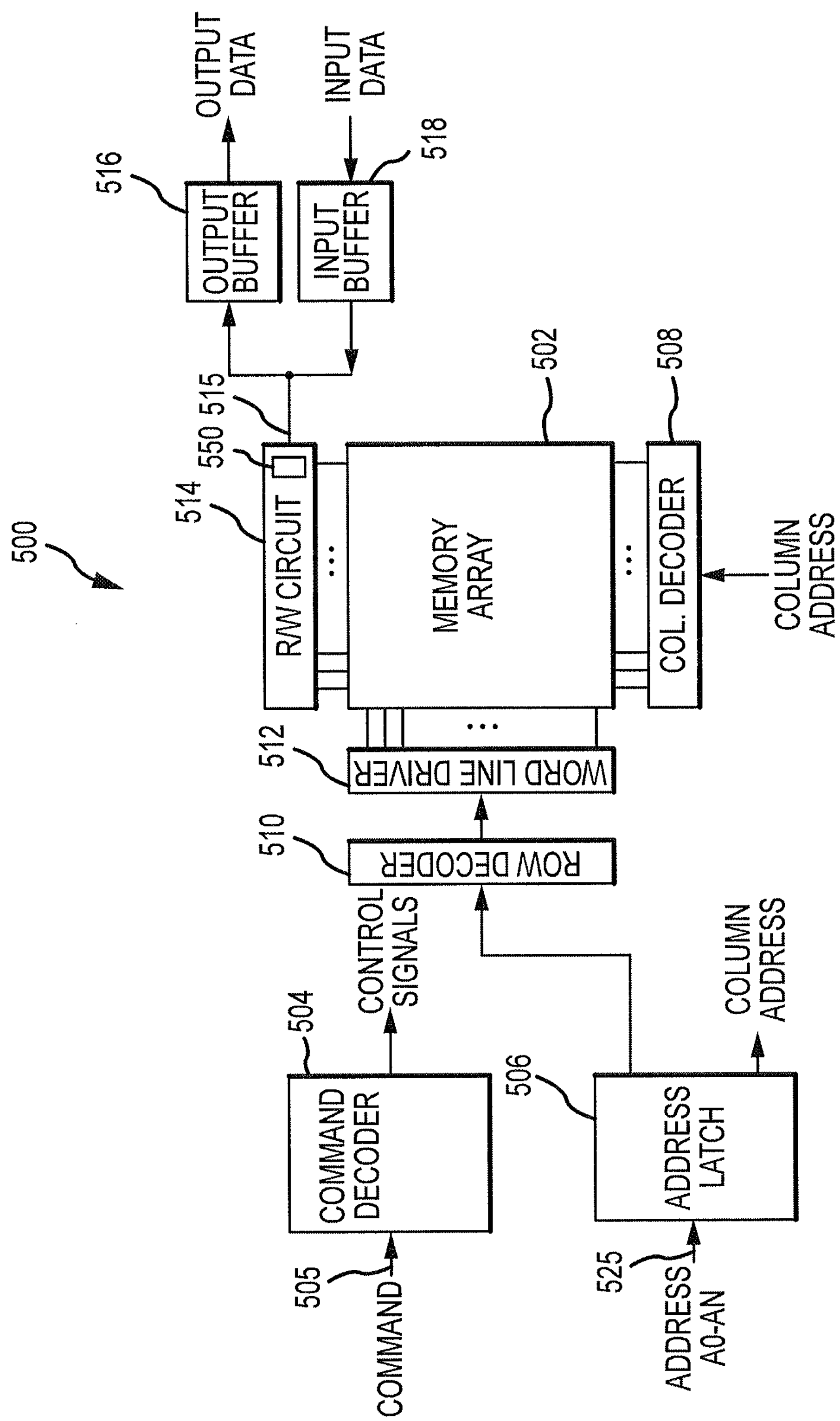
FIG. 5 illustrates a portion of a memory according to an embodiment of the invention.

FIG. 5 illustrates a portion of a memory 500 according to an embodiment of the invention. The memory 500 includes an array 502 of memory cells, which may be, for example, dynamic random access memory ("DRAM") memory cells, static random access memory cells ("SRAM"), flash memory cells, or any other type of memory cells known now or later by those having ordinary skill in the art. The memory 500 may include a command decoder 504 that may be configured to receive memory commands through a command bus 505 and generate corresponding control signals within the memory 500 to carry out various operations. In at least one embodiment, for example, the command decoder 504 may respond to memory commands applied to the command bus 505 to perform various operations on the array 502. In particular, the command decoder 504 may be used to provide internal control signals to read data from and write data to the array 502. Row and column address signals may be applied to the memory 500 through an address bus 525 and provided to latch 506, and may respond to address signals applied to the address bus 525 to provide separate column and row addresses.

The separate column and row addresses may be received by a column address decoder 508 and a row address decoder 510, respectively. The column address decoder 508 may select bit lines in the array 502 corresponding to respective column addresses. The row address decoder 510 may be coupled to a word line driver 512 that is configured to activate respective rows of memory cells in the array 502 corresponding to the row addresses received by the row address decoder 510.

The selected data line (e.g., a bit line or, bit lines) corresponding to a received column address may be coupled to a read/write circuit 514 to provide read data to a data output buffer 516 via a data bus 515. Write data may be applied to the array 502 through a data input buffer 518 and the read/write circuit 514.

The read/write circuit 514 may include at least one apparatus 550 according to an embodiment of the invention. Read data and write data provided to the read/write circuit 514 may be transmitted over input-output lines and may be amplified by the apparatus 550 before being provided to the output buffer 516 and before being written to the array 502, respectively. The apparatus 550 may comprise any of the embodiments of memory apparatuses described herein.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:

a current mode sense amplifier comprising a pair of p-type transistors configured to receive complementary supply voltage signals at respective sources, the current mode sense amplifier configured to provide an output current based on the complementary supply voltage signals; and a current circuit, comprising:

a bias generator configured to generate an analog bias signal;

a current control circuit coupled to the bias generator and the current mode sense amplifier, the current control circuit configured to receive the output current and the analog bias signal, the current control circuit further configured to control the output current to provide a ratio between the output current and a magnitude of the analog bias signal less than 1; and a pair of switches configured to equalize nodes of the current mode sense amplifier during equilibration responsive to a complementary pair of switch signals.

2. The apparatus of claim 1, wherein the current control circuit comprises a plurality of transistors each having respective gate terminals, each of the plurality of transistors configured to receive the analog bias signal at the respective gate terminals.

3. The apparatus of claim 2, wherein the bias generator comprises a transistor having a gate terminal, the transistor configured to provide the analog bias signal and further configured to be matched to the plurality of transistors.

4. The apparatus of claim 3, wherein the transistor and the plurality of transistors comprise field effect transistors.

5. The apparatus of claim 1, wherein the analog bias signal is based on a reference current.

6. The apparatus of claim 5, wherein the bias generator comprises a current source configured to generate the reference current.

7. The apparatus of claim 1, wherein a first switch of the pair of switches is a p-type transistor and a second switch of the pair of switches is an n-type transistor.

8. The apparatus of claim 1, wherein the current mode sense amplifier comprises a first p-type transistor configured to provide the output current, and a second p-type transistor configured to provide a complement of the output current.

9. An apparatus, comprising:

a current mode sense amplifier comprising a pair of p-type transistors configured to receive complementary supply voltage signals at respective sources, the current mode sense amplifier configured to provide an output current based on the complementary supply voltage signals; and a current circuit coupled to the current mode sense amplifier and configured to receive the output current, the current circuit further configured to generate an analog bias signal and reduce the voltage dependency on the supply voltage to provide a ratio of the output current to a magnitude of the analog bias signal less than 1.

10. The apparatus of claim 9, wherein the current circuit comprises a bias generator configured to generate the analog bias signal based, at least in part, on a reference current.

11. The apparatus of claim 10, wherein the analog bias signal is generated independently of the supply voltage.

12. An apparatus, comprising:

a current mode sense amplifier configured to provide an output current based, at least in part, on a supply voltage, wherein the current mode sense amplifier comprises a pair of p-type transistors configured to receive complementary supply voltage signals at respective sources and to provide the output current based on the complementary supply voltage signals; and a current circuit coupled to the current mode sense amplifier and configured to receive the output current, the current circuit further configured to generate an analog bias signal and control the output current to provide a ratio of the output current to a magnitude of the analog bias signal less than 1.

13. The apparatus of claim 12, further comprising:

a memory array including a plurality of memory cells; and a read/write circuit coupled to the memory array and including the current mode sense amplifier.

14. The apparatus of claim 13, further comprising:

a bus coupled to the read/write circuit configured to receive write data from the read/write circuit; and an output buffer coupled to the bus, the output buffer configured to receive the write data from the bus.

15. The apparatus of claim 12, wherein the current circuit further comprises a current source and a diode coupled transistor coupled in series with the current source.

16. A method, comprising:

generating an analog bias signal;

providing the analog bias signal to a current control circuit;

receiving complementary supply voltage signals at respective sources of a pair of p-type transistors of a sense amplifier;

generating an output current responsive, at least in part, to enabling the sense amplifier, wherein the output current is provided from the pair of p-type transistors based on the complementary supply voltage signals; and controlling the output current, based, at least in part, on a magnitude of the analog bias signal to provide a ratio of the output current to the magnitude of the analog bias current less than 1.

17. The method of claim 16, wherein the current control circuit comprises a transistor configured to receive the analog bias signal at a gate terminal.

18. The method of claim 16, wherein generating the bias signal, comprises:

providing a reference current to a diode coupled transistor; and providing the analog bias signal to respective gate terminals of a plurality of transistors.

19. The method of claim 16, wherein the analog bias signal is an analog voltage signal.

20. A method, comprising:

equalizing voltages of a sense amplifier via a pair of switches responsive to a complementary pair of switch signals;

receiving first and second signals from respective signal lines at respective sources of a pair of p-type transistors;

determining a voltage difference between the first and second signals;

generating an output current via the pair of p-type transistors responsive, at least in part, to the voltage difference; and controlling the output current based, at least in part; on a magnitude of an analog bias signal, to provide a ratio of the output current to the magnitude of the analog bias signal less than 1, wherein the bias signal is generated independently of the supply voltage.

21. The method of claim 20, further comprising:

amplifying the voltage difference; and outputting the amplified voltage difference to first and second output terminals.

22. The method of claim 20, wherein the respective signal lines are configured to extend through a memory array.

23. The method of claim 20, wherein said controlling the output current, comprises:

reducing a voltage dependency of the output current on the supply voltage.

* * * * *